United States Patent
Gonzalez, Jr. et al.

(10) Patent No.: US 6,811,669 B2
(45) Date of Patent: Nov. 2, 2004

(54) METHODS AND APPARATUS FOR IMPROVED CURRENT DENSITY AND FEATURE FILL CONTROL IN ECD REACTORS

(75) Inventors: David Gonzalez, Jr., Plano, TX (US); Matthew W. Losey, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 188 days.

(21) Appl. No.: 10/215,411

(22) Filed: Aug. 8, 2002

(65) Prior Publication Data

US 2004/0026257 A1 Feb. 12, 2004

(51) Int. Cl.[7] .............................. C25D 5/00; C25D 5/02; C25D 17/00
(52) U.S. Cl. ................ 205/96; 204/224 R; 204/DIG. 7; 205/123; 205/137
(58) Field of Search .......................... 205/96–97, 147, 205/123, 137; 204/224 R, DIG. 7

(56) References Cited

U.S. PATENT DOCUMENTS

| | | | |
|---|---|---|---|
| 3,437,578 A | 4/1969 | Gibbs et al. | |
| 4,183,799 A | * 1/1980 | Sellitto et al. | 204/206 |
| 4,469,566 A | 9/1984 | Wray | |
| 5,084,153 A | * 1/1992 | Mosse et al. | 204/230.3 |
| 5,401,370 A | 3/1995 | Kauper et al. | |
| 5,776,327 A | * 7/1998 | Botts et al. | 205/96 |
| 6,001,235 A | 12/1999 | Arken et al. | |
| 6,027,631 A | 2/2000 | Broadbent | |
| 6,033,540 A | 3/2000 | Kosaki et al. | |
| 6,080,288 A | 6/2000 | Schwartz et al. | |
| 6,103,085 A | 8/2000 | Woo et al. | |
| 6,132,805 A | 10/2000 | Moslehi | |
| 6,179,983 B1 | 1/2001 | Reid et al. | |
| 6,217,736 B1 | 4/2001 | Kopp et al. | |
| 6,251,250 B1 | 6/2001 | Keigler | |
| 6,254,742 B1 | 7/2001 | Hanson et al. | |
| 6,261,426 B1 | 7/2001 | Uzoh et al. | |
| 6,391,168 B1 | * 5/2002 | Ueno | 204/242 |
| 6,402,923 B1 | 6/2002 | Mayer et al. | |

* cited by examiner

*Primary Examiner*—Donald R. Valentine
(74) *Attorney, Agent, or Firm*—Rose Alyssa Keagy; W. James Brady, III; Frederick J. Telecky, Jr.

(57) ABSTRACT

Apparatus and methods are disclosed for electroplating conductive films on semiconductor wafers, wherein field adjustment apparatus is located in a reservoir between a cathode and an anode to influence the electric field used in the plating process. Field adjustment apparatus is presented having one or more apertures, which may be selectively plugged to adjust the electrical fields during plating.

35 Claims, 16 Drawing Sheets

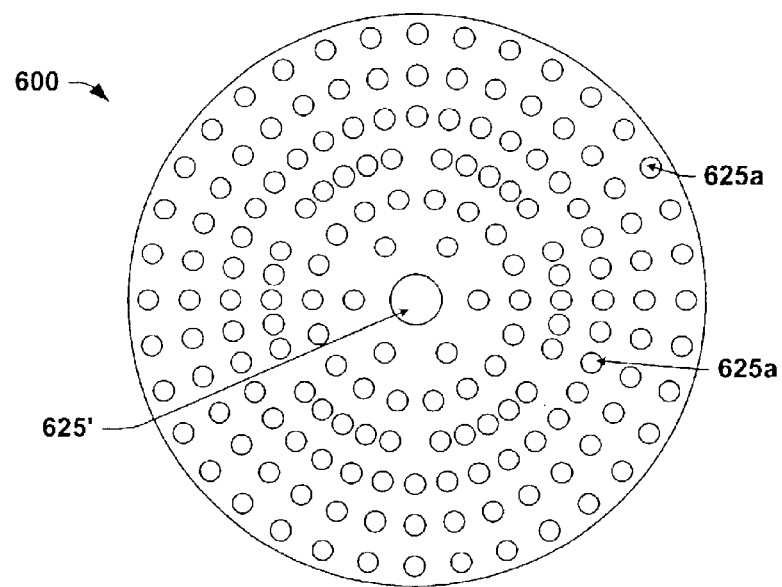
FIG. 13A
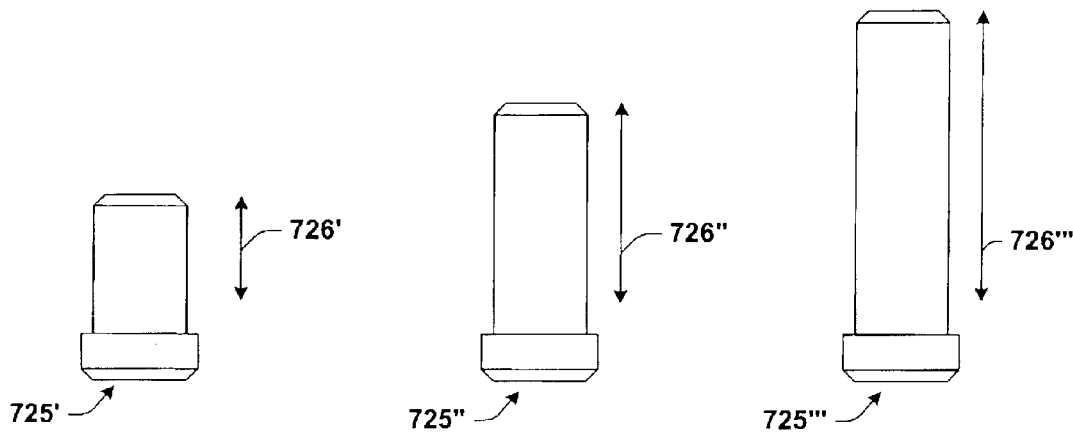
FIG. 13B  FIG. 13C  FIG. 13D

METHODS AND APPARATUS FOR IMPROVED CURRENT DENSITY AND FEATURE FILL CONTROL IN ECD REACTORS

FIELD OF INVENTION

The present invention relates generally to semiconductor devices and more particularly to methods and apparatus for electroplating or electrochemical deposition during metal layer deposition in the manufacture of semiconductor devices.

BACKGROUND OF THE INVENTION

In the manufacture of semiconductor products, individual electrical devices are formed on or in a semiconductor substrate. Thereafter, interconnect processing is performed wherein the electrical devices are interconnected to form electrical circuits. Typically, a multi-level interconnect network is fabricated in layers formed over the electrical devices, by which the device active elements are connected to one another to create the desired circuits. Individual wiring layers within the multi-level network are formed by depositing an insulating or dielectric layer over the discrete devices or over a previous interconnect layer, and patterning and etching cavities such as vias and trenches therein.

Conductive material, such as copper is then deposited into the cavities and the wafer is planarized using chemical mechanical polishing (CMP) to form an interconnect structure. Typical interconnect structures are fabricated using single or dual damascene processes in which trenches and vias are formed (e.g., etched) in a dielectric layer. Copper is then deposited into the trenches and vias and over the insulative layer, followed by CMP planarization to leave a copper wiring pattern inlaid within the dielectric layer trenches and vias. The process is then repeated to form further interconnect layers or levels as needed by which the desired circuit interconnections are made in a multi-level interconnect network.

Diffusion barriers are often formed in the damascene cavities prior to deposition of copper to prevent or reduce diffusion of copper into the dielectric material. Such barriers are typically formed using conductive compounds of transition metals such as tantalum nitride, titanium nitride, and tungsten nitride as well as the various transition metals themselves. Conductive metals, such as aluminum, copper, or the like are then used to fill the cavities after barrier layer formation, where copper is gradually replacing aluminum to improve the conductivity of the interconnect circuits.

The deposition of the conductive copper material in such interconnect processing is generally performed by electroplating, as illustrated in FIGS. 1A–2. This type of processing is sometimes referred to as electrochemical deposition (ECD), and is performed in an electroplating system 2, sometimes referred to as an ECD reactor. In this case, a conductive (e.g., copper) seed layer (not shown) is first formed on a wafer 10 after the diffusion barrier formation, typically via chemical vapor deposition (CVD) or physical vapor deposition (PVD) techniques. In subsequent plating in the system 2, the wafer 10 is electrically coupled with a cathode/wafer holder 4 in a reactor chamber or reservoir 6 filled with electrolytic fluid. The fluid is injected into the reservoir 6 through an inlet port 8, and extracted through an exit port 12.

A voltage is applied across the cathode/wafer holder 4 and an anode 14 via a power source or supply 18 to establish an electric field 16 (e.g., FIG. 1B) in the plating fluid, causing migration and deposition of copper to the wafer workpiece 10 at the wafer holder 4, wherein the wafer 10 operates as a cathode during the plating operation through connection to the wafer holder 4. The initial seed layer thus provides a conductive surface on the wafer 10 such that the electrical connection thereof to the cathode wafer holder 4 causes the electric field lines to end at the wafer 10. The system 2 may further include an anode filter 14a to prevent collection of particulate matter on the cathode 4, which itself is typically fabricated of copper. As illustrated in FIG. 2, the system 2 may further include a fluid dispersion disk 20 with spirally disposed holes 22 to direct the electrolytic plating fluid to the wafer 10 in a controlled fashion.

In a typical ECD process, the plated upper surface of the wafer 10 is located so as to face the anode 14 in the reservoir. The wafer holder structure 4 electrically contacts the plated upper wafer surface at the peripheral edges 10a thereof. However, because the seed layer is of finite thickness, a non-zero resistance exists between interior points 10b on the plated wafer surface and the edge points 10a at which electrical contact is made to the cathode wafer holder clamp 4. The seed layer thus has a non-uniform voltage potential which is positive at the center 10b and negative at the wafer edges 10a, resulting in higher current densities near the wafer edge 10a than at the center 10b, particularly at the beginning of the plating process.

The rate of copper deposition during electroplating at a given point on the wafer surface is generally proportional to the current density thereat. Thus, the deposited copper from the ECD process is thinner at the center 10b than at the edges 10a, due to the seed layer resistance. This is illustrated in a graph 30 in FIG. 1B of deposited copper thickness (y axis) versus position (x axis), wherein the curve 32 has a concave profile. Although subsequent copper deposition in the ECD reservoir 6 reduces this resistance disparity, the initial electrode-position rate in particular is higher at the edges 10a than at the interior 10b of the wafer 10. Thus, the initial deposition causes a concave copper thickness profile 32, which is built up even when the inner and outer deposition rates become closer.

Recent scaling efforts in semiconductor devices have resulted in smaller feature sizes and closer feature spacing. Seed layer thicknesses continue to be reduced accordingly, to avoid necking effects and other problems in filling the gaps between such closely spaced features. As a result, the initial seed layer resistance between the wafer center 10b and the edges 10a continues to increase due to seed layer thinning, thereby worsening the copper deposition uniformity problem. In addition, wafer sizes are increasing, for example, from 200 mm to newer 300 mm diameter wafers. This causes higher voltage drops between the wafer center 10b and edges 10a for a given seed layer thickness and resistivity. Thus, adjustment in the seed layer deposition process step has limited impact on combating the non-uniform deposited copper thickness in interconnect process steps employing electroplating.

Furthermore, conventional CMP processes often suffer from dishing and/or erosion difficulties, wherein material is removed in a non-uniform manner. For example, a CMP process may remove more material from the center 10b of the wafer 10 than from the edges 10a, thereby compounding the ECD deposition non-uniformities. Thus, the ECD process provides thick copper at the edges 10a and thin copper at the center 10b, after which the wafer 10 is planarized by CMP processing which removes material from the (thin) center 10b faster than from the (thick) edges 10a.

While CMP process chemistry and other parameters may be adjusted to reduce material removal non-uniformities, it is generally desirable to provide an electroplating process by which a copper layer of uniform or controllable thickness is deposited prior to CMP processing. Absent such, current efforts include depositing more copper (e.g., lengthening the electroplating process) to ensure complete filling of the thin inner regions 10b of the wafer with sufficient process margin to compensate for the faster CMP removal rate at the center 10b. The CMP planarization, in turn, must be performed for longer periods of time to ensure exposure of dielectric material between the filled trenches at the edges 10a of the wafer 10. Both such process refinements result in a net increase in processing time per wafer (e.g., and thus reduced throughput), which is undesirable.

Furthermore, where it is known that a particular CMP process has a higher material removal rate at the inner regions 10b than at the outer regions 10a, which cannot be further optimized, it may be desirable to deposit copper via an electroplating process providing thicker copper in the center 10b and thinner copper at the edges 10a. However, as mentioned above, conventional copper electroplating techniques do not offer such options. Thus, there remains a need for improved methods and apparatus for electroplating semiconductor wafers and other devices using electroplating, by which the aforementioned difficulties may be mitigated or overcome.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to electroplating conductive films on semiconductor wafers, such as copper deposition during back end interconnect processing in the manufacture of semiconductor devices. The invention may be employed to facilitate adjustment and/or control of electric fields used to plate the wafers, by which improved plating current density uniformity and hence deposition fill uniformity and/or controllability may be facilitated in depositing copper or other materials. Improved fill uniformity, in turn, facilitates reduction in deposition layer thicknesses, and corresponding reduction in the amount of material that needs to be removed in subsequent planarization processing, whereby improved process throughput may be achieved.

One aspect of the invention provides electroplating systems and apparatus therefor, in which a field adjustment plate is located in a reservoir between a cathode and an anode, having plugable apertures to influence the electric field used in the plating process. Plates are presented having one or more apertures, which may be selectively plugged to adjust the electrical fields and hence the current density and metal deposition rates during plating. Plugs are provided, which may extend past the plate surfaces in the direction of the wafer workpiece, wherein the amount of such extension and the shape of the extended portions of the plugs may be used to influence or control the electric field during plating. The field adjustment plate and the plugs may be fashioned of any dielectric type material, such as plastics, by which portions of the electric field between the plating process cathode and anode can be inhibited or adjusted.

Systems employing the various aspects of the invention may selectively employ one or more such plugs in various apertures in the plate, to achieve a desired electric field during plating, and the number and location of plugged apertures may be easily adjusted for a different process recipe. Other aspects of the invention provide electroplating methodologies in which one or more plate apertures is selectively plugged to modify or control electric fields used to deposit copper and other conductive materials in the manufacture of semiconductor and other devices. The invention may thus be employed for spatial control over deposition thickness, even where initial seed layer resistance is relatively high.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 13A is a top plan view illustrating another exemplary field adjustment plate having generally circular apertures in accordance with the invention;

FIGS. 13B–13D are side elevation views illustrating various plugs of differing lengths for use in plugging one or more apertures in the plate of FIG. 13A in accordance with the invention;

DETAILED DESCRIPTION OF THE INVENTION

Figure 1A:
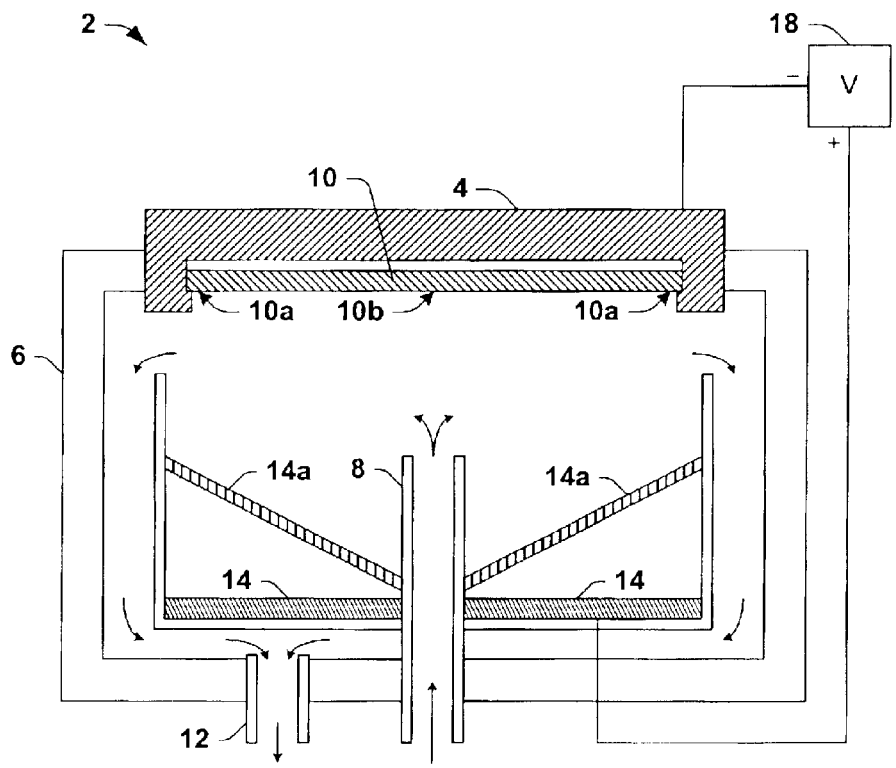
FIG. 1A is a partial side elevation view in section illustrating an electroplating system.

The present invention will now be described with reference to the attached drawings, wherein like reference numerals are used to refer to like elements throughout. Several implementations of the various aspects of the invention are hereinafter illustrated and described in the context of depositing copper on semiconductor wafer workpieces using electroplating techniques during interconnect processing. However, it will be appreciated that the invention may be carried out in association with deposition of other materials on semiconductor wafers and other type of workpieces, and that the invention is not limited to the illustrated implementations.

Figure 3A:
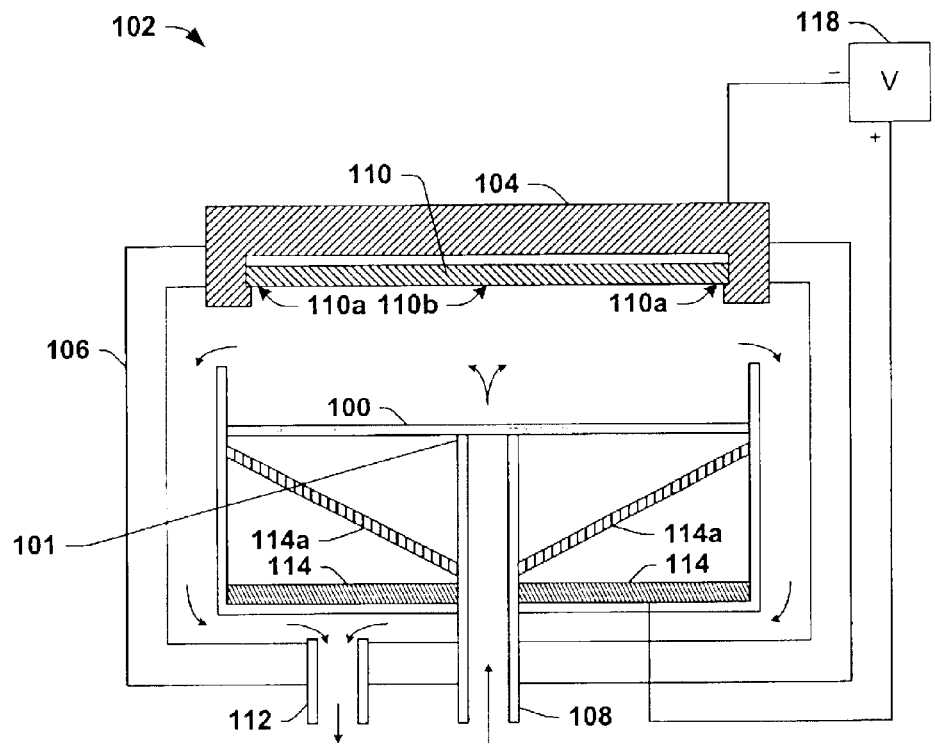
FIG. 3A is a partial side elevation view in section illustrating an exemplary electroplating system having an electric field adjustment plate in accordance with an aspect of the present invention.
Figure 3B:
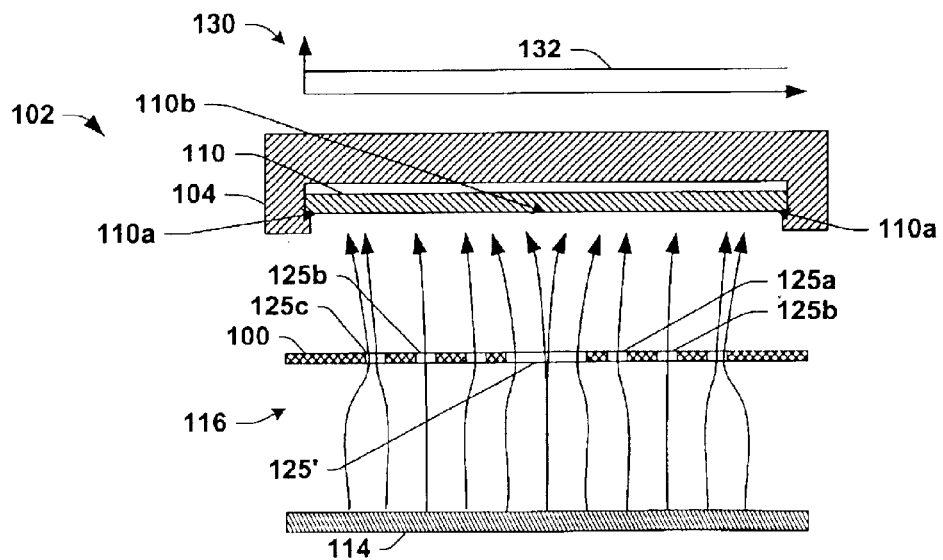
FIG. 3B is a partial side elevation view in section illustrating electric field lines in the exemplary system of FIG. 3A.
Figure 5:
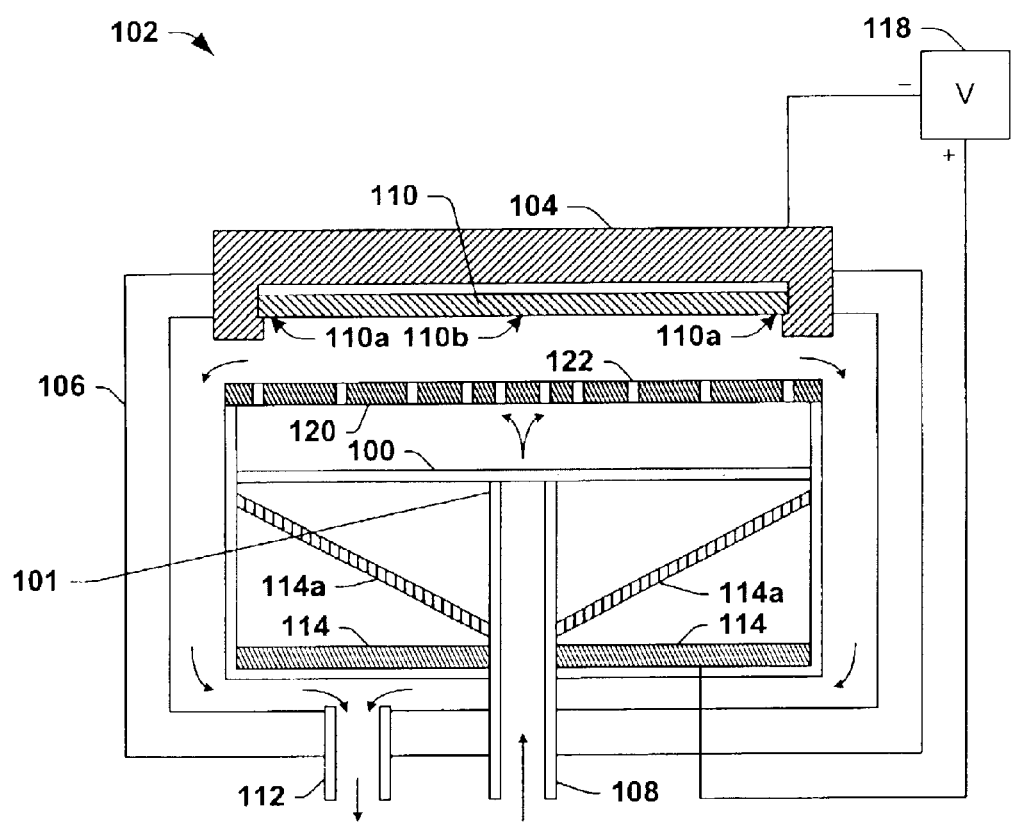
FIG. 5 is a partial side elevation view in section illustrating the electroplating system of FIG. 3 having an electric field adjustment plate and a flow diffuser membrane.

FIGS. 3A, 3B, and 5 illustrate an exemplary electroplating system 102 in accordance with the present invention, comprising an electric field adjustment plate or disk 100 supported in a reservoir 106 by a support apparatus 101 in accordance with an aspect of the present invention, wherein FIG. 3B illustrates electric field lines 116 in the system 102 during a copper electroplating operation providing deposited copper material to a conductive surface of a wafer 110. The wafer 110 is electrically coupled with a cathode wafer holder 104 in a reactor chamber or reservoir 106 filled with electrolytic plating fluid (not shown), wherein connection of the wafer 110 to the holder 104 causes the plated upper surface of the wafer 110 too operate as a cathode in the plating process. The plating fluid is injected into the reservoir 106 through an inlet port 108, and extracted through an exit port 112.

A voltage is applied across the cathode wafer holder 104 (e.g., and the wafer 110) and an anode 114 via a power supply 118 to establish an electric field 116 (e.g., FIG. 3B) in the plating fluid, causing deposition of copper material onto the wafer workpiece 110 at the wafer holder 104. As illustrated in FIG. 3B, the field lines 116 are channeled by one or more apertures 125 in the plate 100. As illustrated and described further below, one or more of the apertures 125 may advantageously be plugged or covered, in whole or in part, with plugs 225 in selective fashion to provide adjustability in the electric field lines 116. An anode filter 114a may optionally be provided to prevent collection of particulate matter on the anode 114, and as shown in FIG. 5, the system 102 may, but need not comprise a fluid diffuser membrane 120 with holes 122 to direct the electrolytic plating fluid to the wafer 110 in a controlled fashion.

Figure 4A:
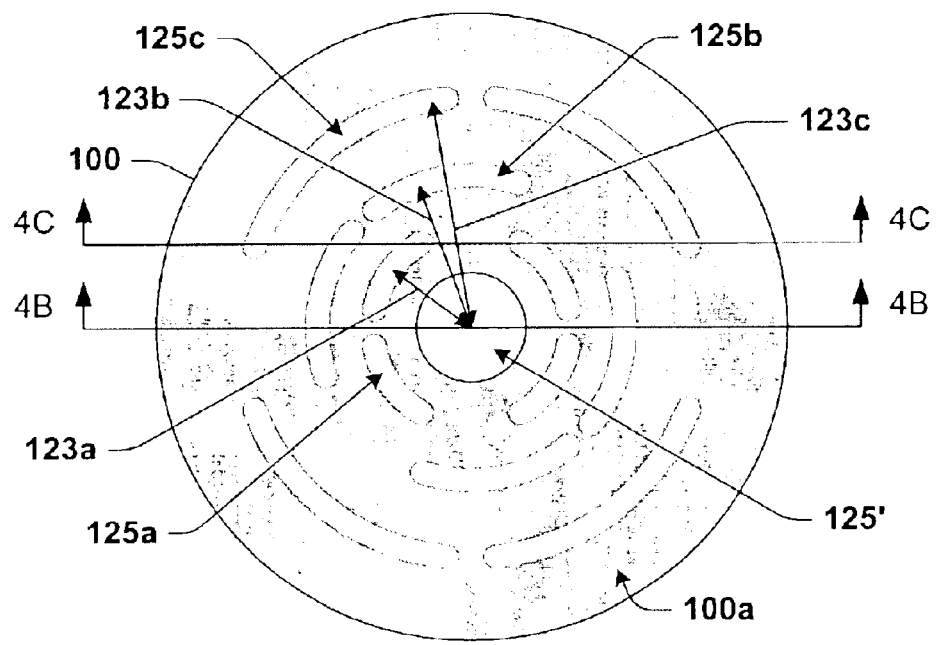
FIG. 4A is a top plan view illustrating an exemplary field adjustment plate having semi-circular slot apertures in accordance with another aspect of the invention.
Figure 4B:
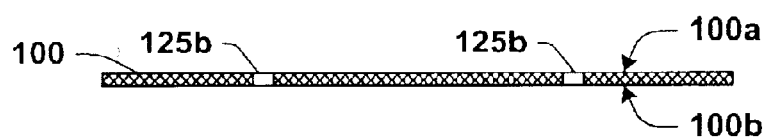
FIGS. 4B and 4C are partial side elevation views in section of the field adjustment plate taken along lines 4B—4B and 4C—4C in FIG. 4A.
Figure 4C:
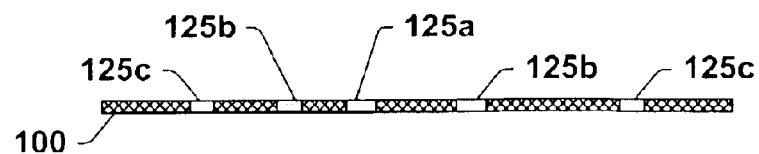

Referring also to FIGS. 4A–4C, the exemplary field adjustment plate 100 is generally circular and comprises a center aperture 125' generally at the center of the plate 100. Although the plate 100 and other field adjustment plates illustrated and described herein are generally circular, any other plate shape is contemplated as falling within the scope of the present invention and the appended claims. As with the other apertures 125 in the plate 100, the center aperture 125' extends between generally circular first and second sides 100a and 100b, respectively, wherein the plate 100 is supported by the support apparatus 101 such that the first side 100a is generally facing the cathode 104 and hence the wafer 110, with the second side 100b facing the anode 114.

In addition to the center aperture 125', the illustrated field adjustment plate 100 comprises three sets of semi-circular slot-shaped plate apertures 125a, 125b, and 125c extending through the plate 100 between the sides 100a and 100b. The sets of semicircular slot apertures 125a, 125b, and 125c are individually disposed from the center of the plate by first, second, and third radial distances 123a, 123b, and 123c, respectively, and the slots 125a, 125b, and 125c in the first, second, and third aperture sets are angularly spaced from one another.

Figure 1B:
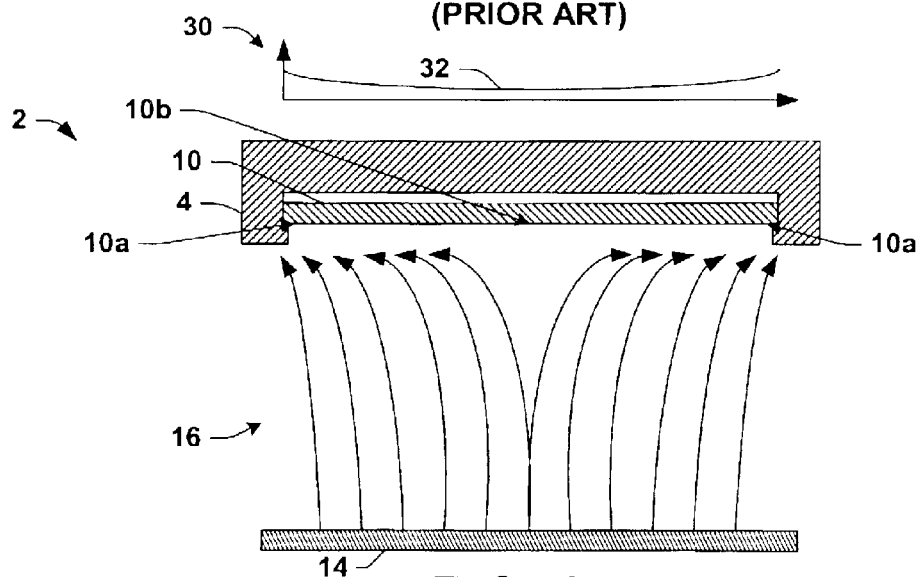
FIG. 1B is a partial side elevation view in section illustrating electric field lines in the system of FIG. 1A.
Figure 2:
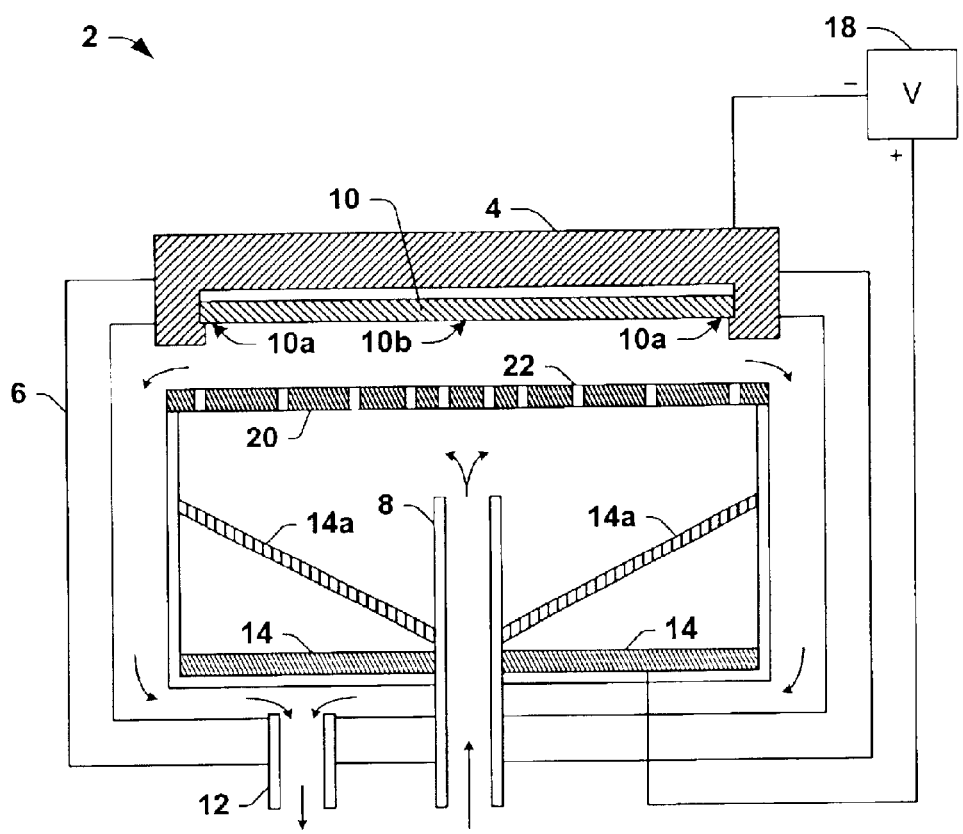
FIG. 2 is a partial side elevation view in section illustrating the electroplating system of FIG. 1 having a flow diffusing membrane.

As illustrated in FIG. 3B, the apertures 125 operate to channel the electric field lines 116 to influence the electric field at the plated wafer surface in a controlled fashion. In this example, the exemplary plate 100 with apertures 125 influences the electric field 116 so as to provide a relatively uniform deposition thickness 132 across the surface of the wafer 110, as seen in the graph 130 of copper thickness (y axis) versus position (x axis). It is noted from the plot 130 of FIG. 3B and the plot 30 of FIG. 1B, that the field adjustment plate 100 of the system 102 advantageously mitigates the non-uniform plating 32 experienced in the conventional system 2, by channeling the field lines 116 more toward the center 110b of the wafer 110. Thus, even if employed with non-uniform CMP planarization processes, the plating capabilities of the exemplary system 102 may provide substantial processing advantages, such as increasing throughput in both the copper plating deposition and CMP planarization process steps.

It is also noted that while the exemplary plate 100 provides improved copper plating uniformity, other desired deposition thickness profiles, including non-uniform profiles, may be achieved in accordance with the invention, wherein different aperture sizes, shapes, and locations are provided in the field adjustment plate 100. For example, a convex deposition profile may be desired (e.g., thicker in the center 110b than at the edges 110a) so as to counteract or compensate for CMP processes in which material is removed from the center 110b faster than from the edges 110a.

Figure 6A:
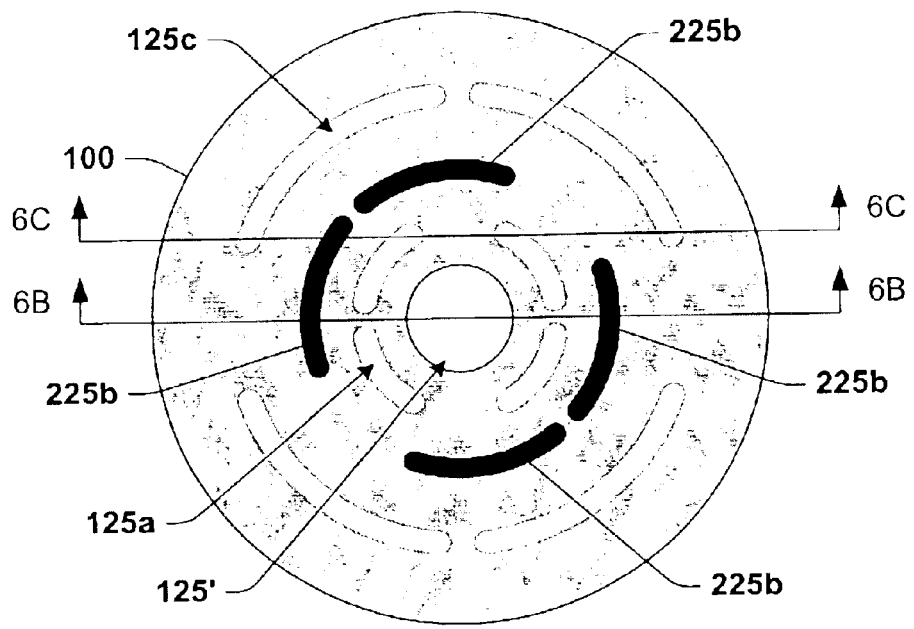
FIG. 6A is a top plan view illustrating the plate of FIGS. 4A–4C having semicircular slot plugs positioned to plug several of the plate apertures in accordance with another aspect of the invention.
Figure 6B:
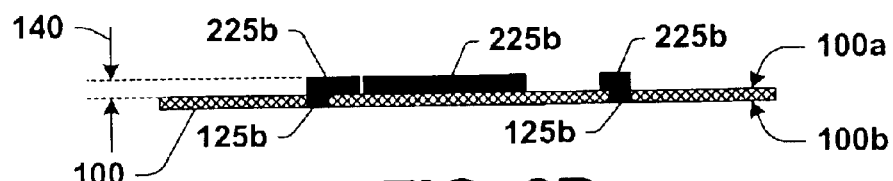
FIGS. 6B and 6C are partial side elevation views in section of the field adjustment plate and plugs taken along lines 6B—6B and 6C—6C in FIG. 6A.
Figure 6C:
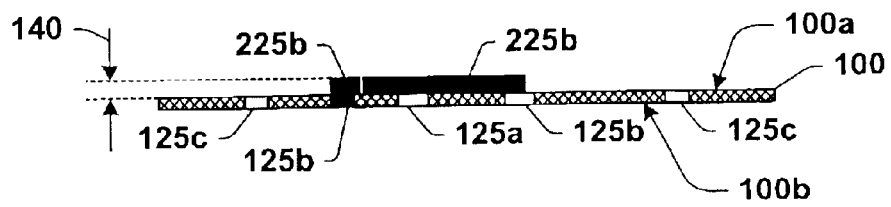
Figure 6D:
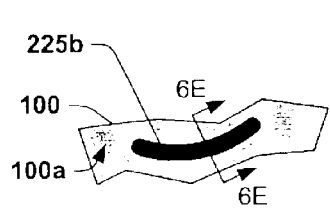
FIG. 6D is a top plan view illustrating an exemplary semi-circular plate aperture plug in accordance with another aspect of the invention.
Figure 6E:
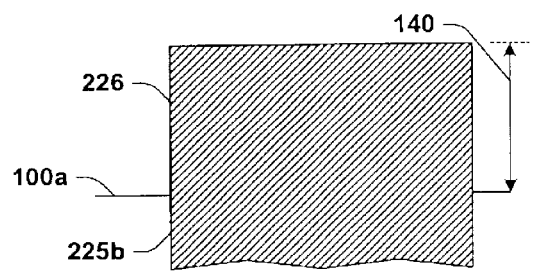
FIGS. 6E–6I are partial side elevation views in section of exemplary extension portions of plugs taken along line 6E—6E in FIG. 6D in accordance with another aspect of the invention.
Figure 6F:
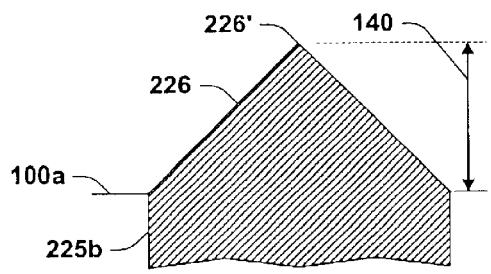
Figure 6G:
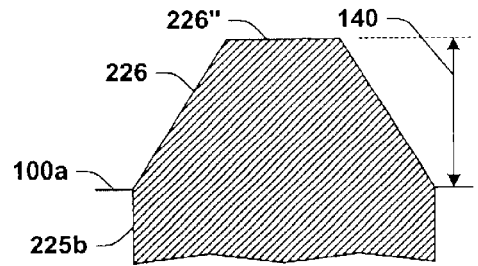
Figure 6H:
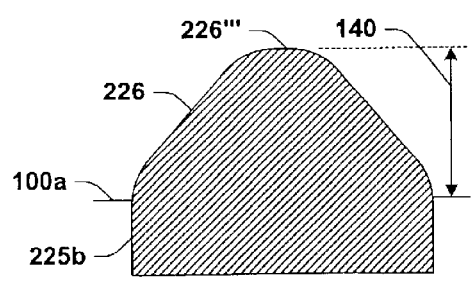
Figure 6I:
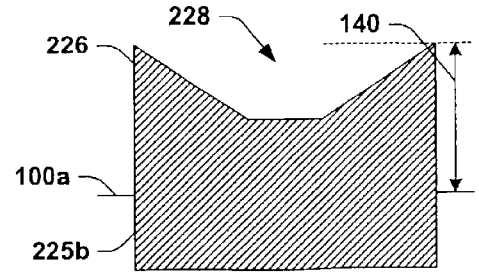
Figure 7:
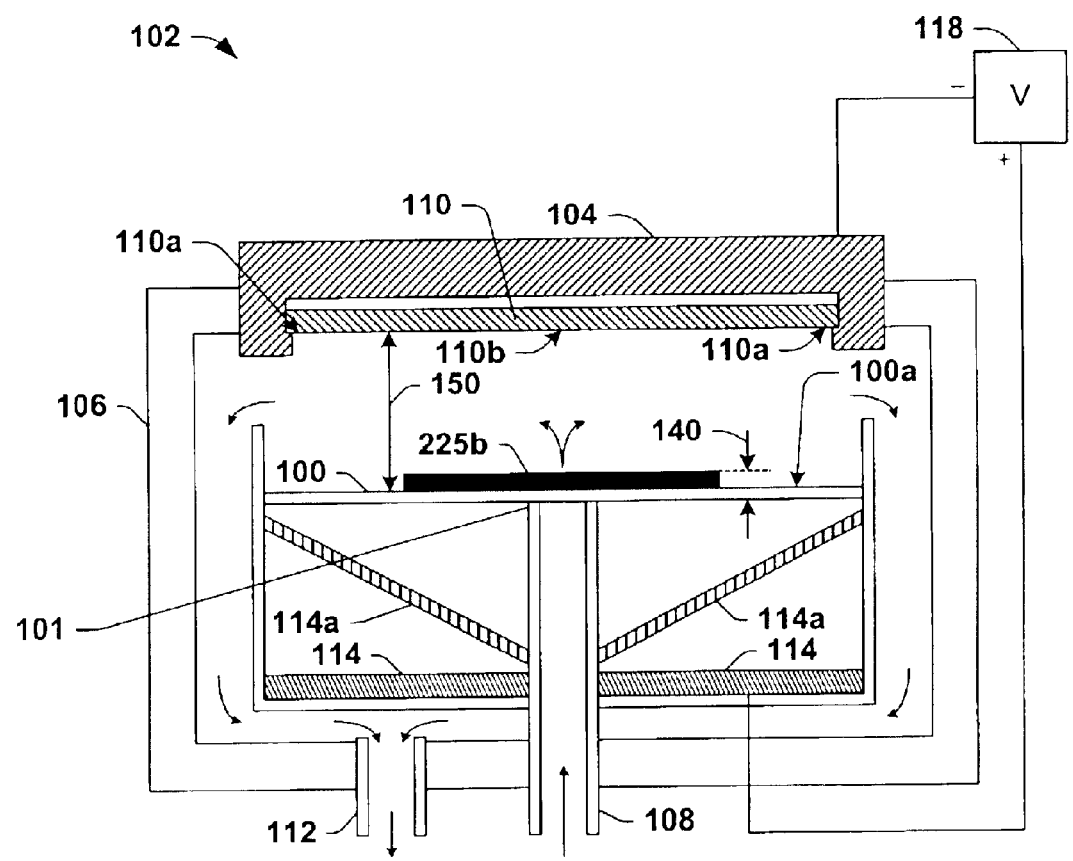
FIG. 7 is a partial side elevation view in section illustrating the electroplating system of FIGS. 3 and 5 having an electric field adjustment plate with one or more plugged apertures using the plugs of the type illustrated in FIGS. 6D–6I extending toward a wafer workpiece being plated.

Referring now to FIGS. 6A–7, other aspects of the invention provide for selectively plugging one or more of the apertures 125 of the field adjustment plate 100 so as to adjust the field distribution and hence to provide further control over the final deposition thickness profile, and for extending the plug devices beyond the surface of the plate 100 to affect the electric plating fields in the reservoir 106. In FIGS. 6A–6C, the exemplary field adjustment plate 100 is illustrated having the second set of semi-circular slot apertures 125b plugged using corresponding semi-circular plugs 225b. Any number of the apertures 125 may be plugged in accordance with this aspect of the invention, including plugging less than all of the apertures 125 in a given aperture set.

Moreover, individual apertures 125 may, but need not be, wholly plugged, wherein partial plugging of one or more of the apertures may advantageously influence the electric field in the reservoir to a desired degree to achieve the desired resulting deposition thickness profile. This facilitates refined adjustment to the resulting field, and hence to the plating process current density and deposition rates across the conductive surface of the wafer workpiece 110. Thus, the invention contemplates whole or partial plugging of the apertures 125 using the plugs 225 or other plug devices not specifically illustrated or described herein.

Moreover, the plugs 225b may be fashioned so as to extend through the apertures 125b between the first and second sides 100a and 100b, and beyond the first side 100a by a distance 140 (e.g., in a direction generally toward the wafer workpiece 110). Thus, portions of the exemplary plugs 225b extend toward the wafer 110, as illustrated in FIG. 7, wherein the plate 100 is supported within the plating reservoir 106 a distance 150 from the wafer 110. In this regard, the inventors have appreciated that the selective plugging of one or more of the plate apertures 125 and/or the extension of the plugs 225 in the general direction of the wafer 110 may be employed separately or in combination to advantageously influence the behavior of electric fields at or near the surface of the wafer 110 during ECD processing. Further, the plugs in accordance with the invention may alternatively or in combination comprise protrusions extending outwardly from the first side 110a of the plate 110 by a distance 140, which need not be removable from the plate 110, so as to influence, adjust, modify, and/or alter the electric field near one or more of the apertures 125.

The plugs 225 and the field adjustment plate 100 may be fabricated of any appropriate material, such as plastics, to prevent the field lines 116 (FIG. 3B) from passing therethrough, except as allowed by the location of the unplugged apertures 125. In this regard, the extension of portions of the plugs 225 by the distance 140 beyond the first side 110a of the field adjustment plate 100 further influences the electric field behavior by directing the field lines 116 closer to the wafer surface. In this manner, both the plugs 225 and the non-aperture portions of the field adjustment disk 100 operate to selectively inhibit, redirect, and/or intensify the electric fields in the reservoir 106 according to their location.

The invention further contemplates automated selection and placement of plugs 225 in disk apertures 125 in the system 102 according to a desired plating profile, for example, wherein a particular process recipe may determine which (if any) plugs 225 are to be used in plating a particular batch of wafers 110. Further, different field adjustment plates 100 and corresponding plugs 225 could be selected based on recipe or other considerations, so as to control the plating thickness to any desired design parameter within the scope of the invention. Moreover, the amount or length of plug extension 140 can be selectively adjusted according to such considerations. Alternatively or in combination with the above, plugs 225 and/or field adjustment plates 100 of different material types may be chosen according to such recipe or batch specifications.

Figure 8:
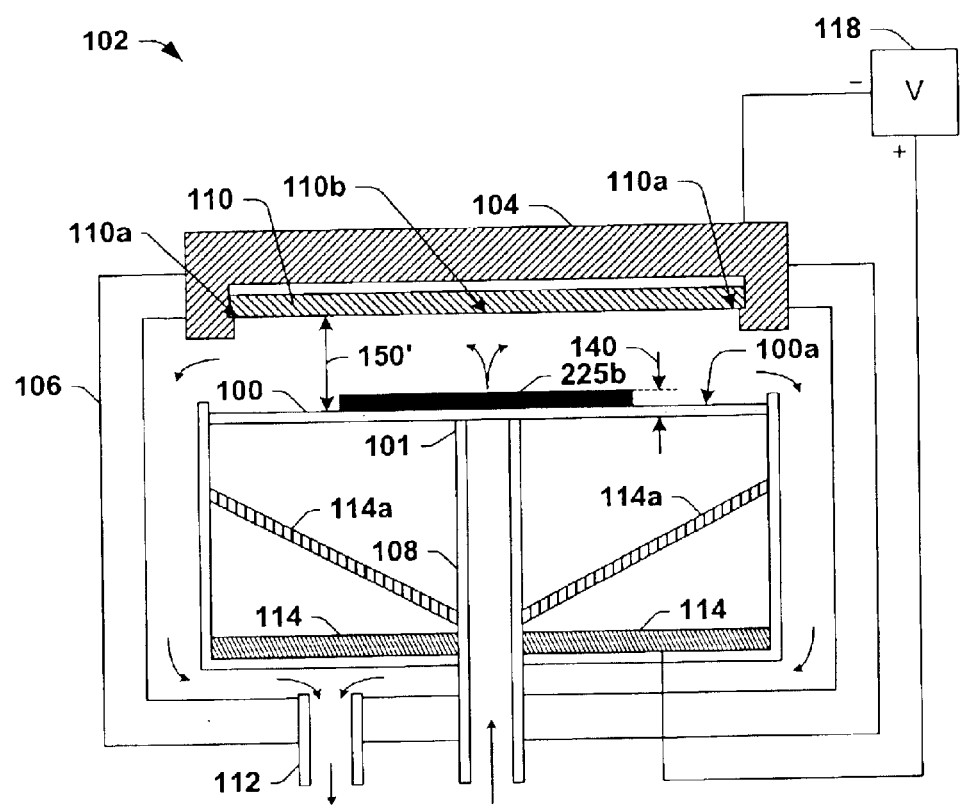
FIG. 8 is a partial side elevation view in section illustrating the electroplating system of FIG. 7 having the electric field adjustment plate elevated toward the wafer workpiece.
Figure 9:
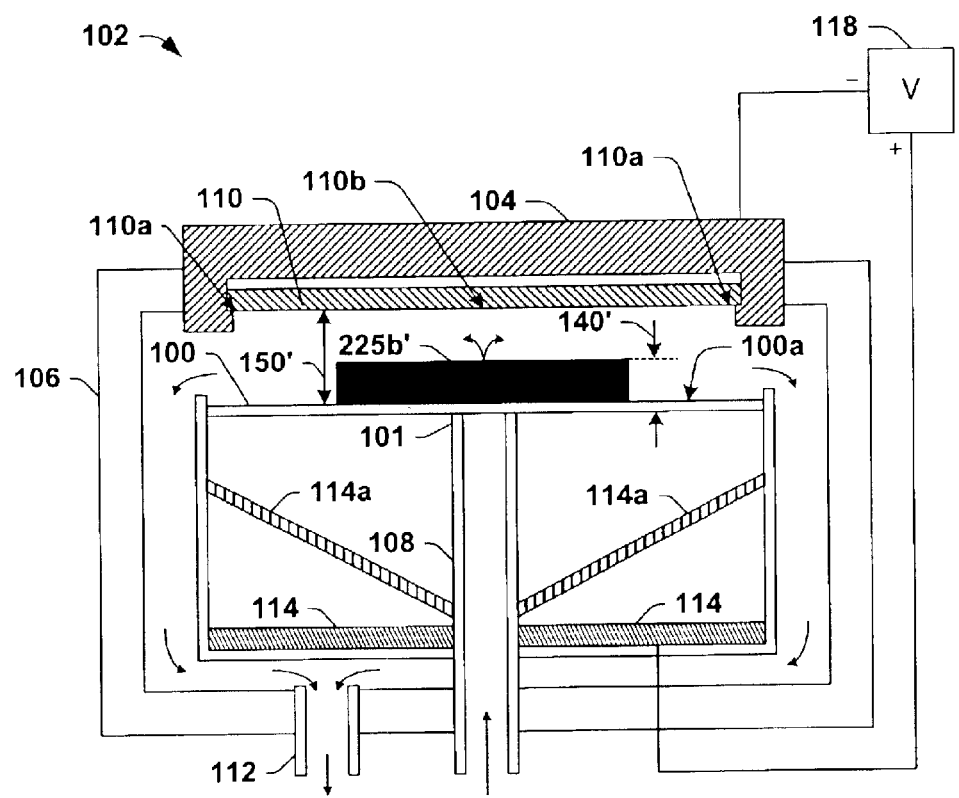
FIG. 9 is a partial side elevation view in section illustrating the electroplating system of FIGS. 3, 5, 7, and 8 having the electric field adjustment plate with longer plugs extending toward the wafer workpiece.

Referring also to FIGS. 8 and 9, the electric fields 116 in the reservoir 106 may be further modified by changing the location of the field adjustment disk 100 (e.g., and hence of any plugs 225 therein) relative to the wafer workpiece 110. As illustrated in FIG. 8, for example, the support 101 may be raised to provide closer spacing 150' between the plate 100 and the wafer 110. Alternatively, or in combination, longer plugs 225b' can be employed, which extend a further distance 140' beyond the side 110a of the plate 100 toward the wafer 110, as illustrated in FIG. 9.

It will thus be appreciated that any combination of adjustments to the number and location of apertures 125, the number and location of plugs 225, the spacing 150 between the wafer 110 and the plate 100, and the extension length 140 of the plugs 225, whether automated or manual, may be employed in accordance with the present invention, so as to achieve a desired plating current density profile, and hence a desired deposition rate profile across the surface of the wafer 110. As discussed above, the improved control over the metal deposition may advantageously facilitate shortening of the deposition plating process, and also shortening of the subsequent CMP planarization step and/or other material removal process, and/or facilitate making these two processes compatible with one another.

Referring also to FIGS. 6D–6I, another aspect of the invention provides field adjustment plugs 225 comprising extension portions 226 having different shapes, which extend outward beyond the first side 100a of the field adjustment plate 100 along the extension distance 140. In one example, the plugs 225b may have an extension portion 226 with a generally rectangular cross-sectional profile, as illustrated in FIG. 6E. Any extension portion shape is contemplated as falling within the scope of the invention, some examples of which are presented in FIGS. 6F–6I, taken along section line 6E—6E of FIG. 6D. In FIGS. 6F–6H, convex tapered shapes are provided, one ending in a point 226' (FIG. 6F), another ending in a flat upper surface 226" (FIG. 6G), and still another ending in a rounded surface 226'" (FIG. 6H). Concave shapes are also possible, such as the shape of FIG. 6I having a recess 228.

The illustrated examples of FIGS. 6E–6I are exemplary in nature, and it will be appreciated by those of ordinary skill in the art that the invention may be implemented using plug extension portions of any shape, so as to modify or control the behavior of electric fields during the ECD plating process in a controllable manner. Furthermore, although the exemplary plugs 225 illustrated and described herein generally extend laterally within the lateral dimensions of the apertures 125 in which they are positioned, the invention contemplates plugs extending laterally beyond the aperture dimensions. For example, plugs 225 could be fashioned having extension portions 226 with lateral dimensions much larger than the lateral aperture dimensions, which could be inserted from the first side 100a of the plate 100 within the scope of the invention.

Moreover, while the exemplary plugs 225 herein are generally illustrated as being coextensive with and substantially or completely plugging the corresponding apertures 125 in which they are placed, plugs 225 need not fully or even substantially plug an aperture 125 in which they are positioned, wherein it will be appreciated that partial plugging of such apertures 125 may be employed in accordance with the present invention so as to influence the electric field behavior and hence the deposition rates and thicknesses during plating. It is further noted in this regard, that the center aperture 125' of the exemplary plate 100 may also be fully or partially plugged in accordance with the invention.

Figure 10A:
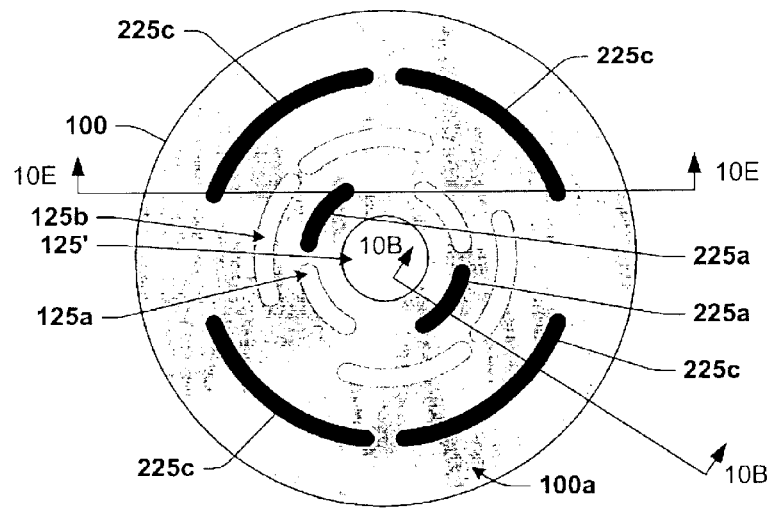
FIG. 10A is a top plan view illustrating the exemplary plate of FIG. 4A having semi-circular slot plugs of differing angular lengths positioned in first and second radially disposed aperture sets in accordance with another aspect of the invention.
Figure 10B:
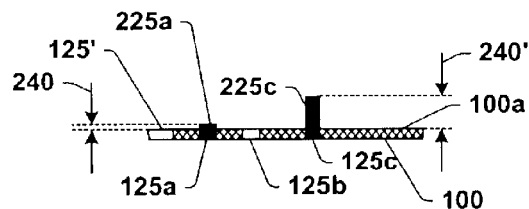
FIGS. 10B–10D are partial side elevation views in section of the field adjustment plate and plugs taken along line 10B—10B in FIG. 10A.
Figure 10C:
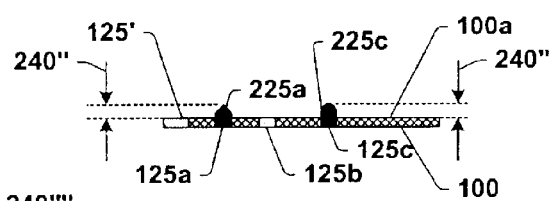
Figure 10D:
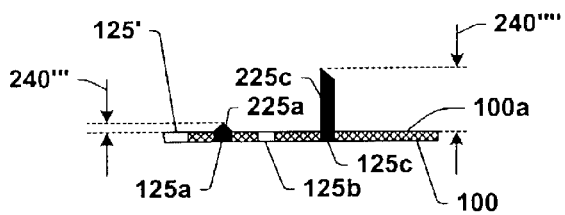

Referring also to FIGS. 10A–10D, another aspect of the invention involves the use of different sized plugs 225 in the exemplary disk 100. In the implementation of FIG. 10A, first plugs 225a are positioned in one or more of the first semi-circular slot apertures 125a (e.g., two in the illustrated example), while second plugs 225c are positioned in one or more of another set of apertures 125c (e.g., four in this case). Referring to FIG. 10B, the plugs 225a and 225c may extend beyond the first side 100a by different distances 240 and 240', respectively. Another implementation is illustrated in FIG. 10C (also taken along line 10B—10B of FIG. 10A), in which the plugs 225a and 225c are of the same extension length 240", but have different extension portion shapes. In FIG. 10D (also taken along line 10B—10B of FIG. 1A), the two plugs 225a and 225c have different shapes as well as different extension lengths 240'" and 240"", respectively.

Figure 10E:
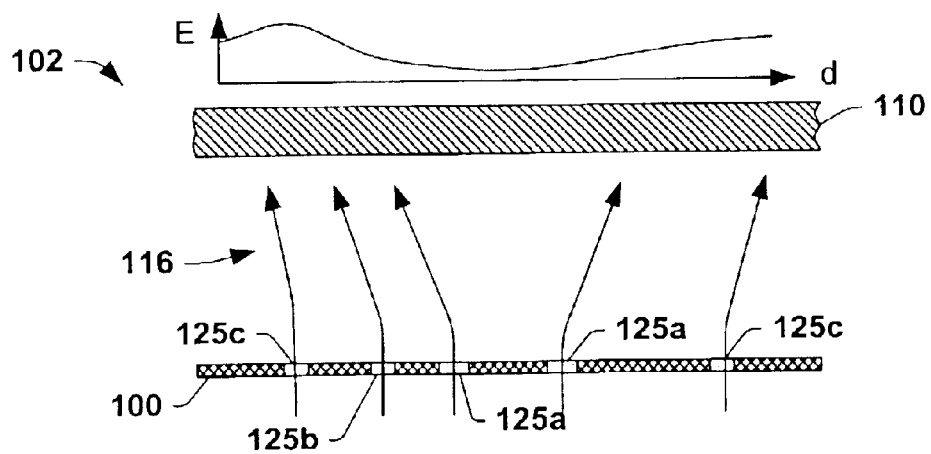
FIGS. 10E–10G are partial side elevation views in section taken along the line 10E—10E of the plate and plugs of FIG. 10A, illustrating the effect of the plate apertures and plugs on the electric field between the anode and the wafer workpiece in accordance with the invention.
Figure 10F:
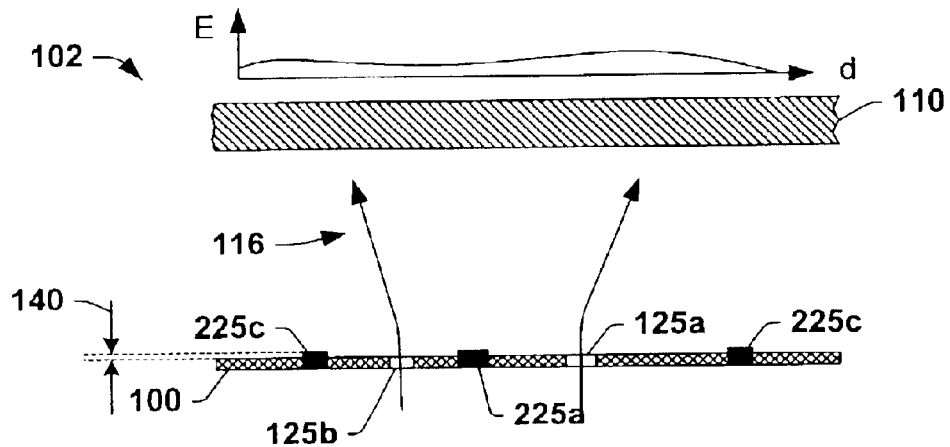
Figure 10G:
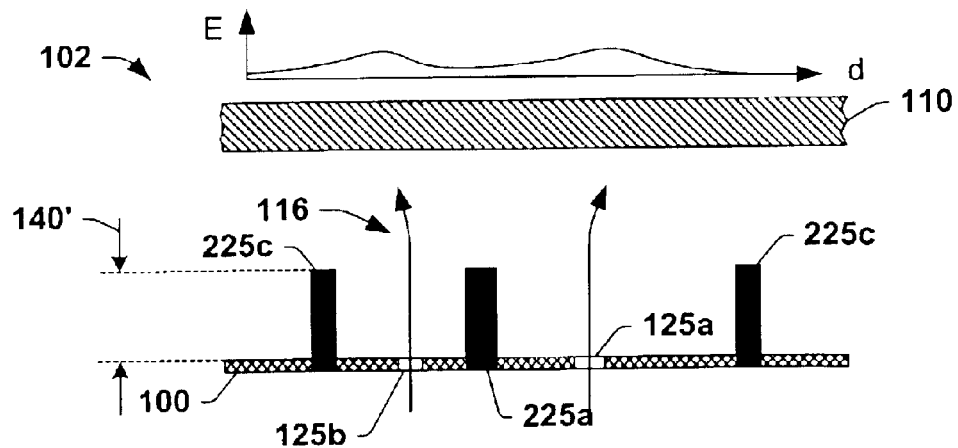

Referring now to FIGS. 10E–10G, the invention may be employed to advantageously modify or control the deposition thickness profile during electroplating of semiconductor wafers 110 or other workpieces, wherein three exemplary implementations and the corresponding electric field profiles are illustrated. As discussed above with respect to FIG. 1B, the resistance of thin seed layers initially causes electroplating deposition rates to be significantly higher at the edges 10a of the wafer 10 than at the center 10b absent the advantages of the present invention. As illustrated in FIG. 10E, the provision of the field adjustment plate 100 between the anode 114 and the cathode 104 in the exemplary plating system 102 (FIGS. 3A, 5, and 7–9) influences the distribution of the electric field 116 within the reservoir 106 to direct the deposition plating current density back toward the wafer center 110b, as shown in the corresponding plot of electric field strength E versus position or distance d in FIG. 10E.

As shown in FIG. 10F, the inclusion of one or more relatively short plugs 225 in various apertures 125 of the plate 100 provides further adjustment or modification of the electric field behavior, and hence of the deposition rates at the wafer 110. FIG. 10G illustrates another case in which longer plugs 225a and 225c are provided in the plate 100. As can be seen from these examples, the invention provides the possibility for fine tuning the electric fields 116 during plating so as to achieve virtually any desired deposition profile. It will be noted at this point, that although various plugs 225 are illustrated herein as extending beyond one or both of the first or second sides 100a and 100b of the plate 100, that the invention also contemplates plug devices not extending beyond either of the sides 100a or 100b.

Figure 11A:
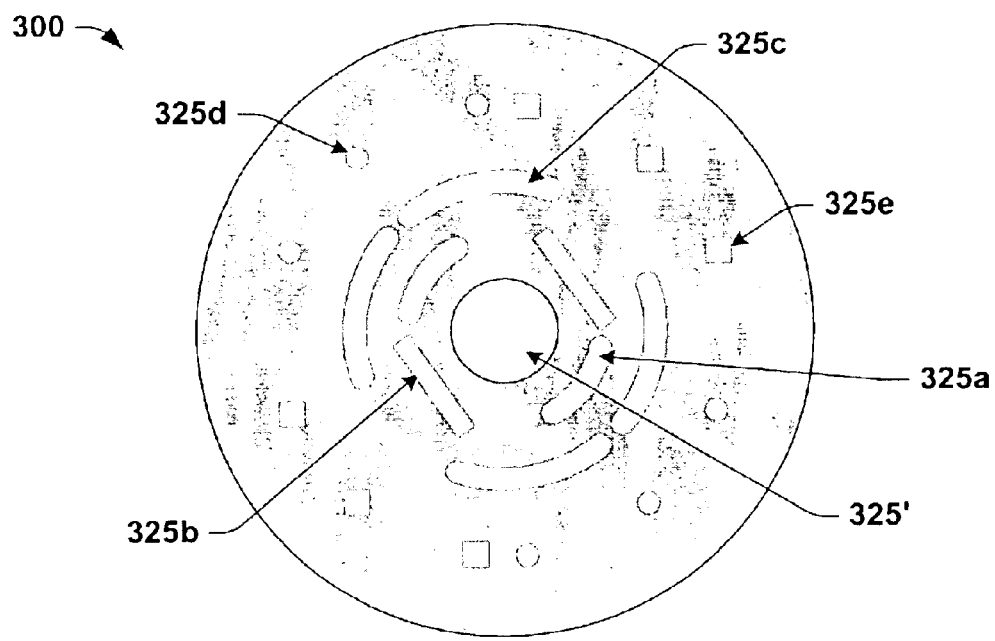
FIG. 11A is a top plan view illustrating another exemplary field adjustment plate having apertures of differing sizes and shapes in accordance with another aspect of the invention.
Figure 11B:
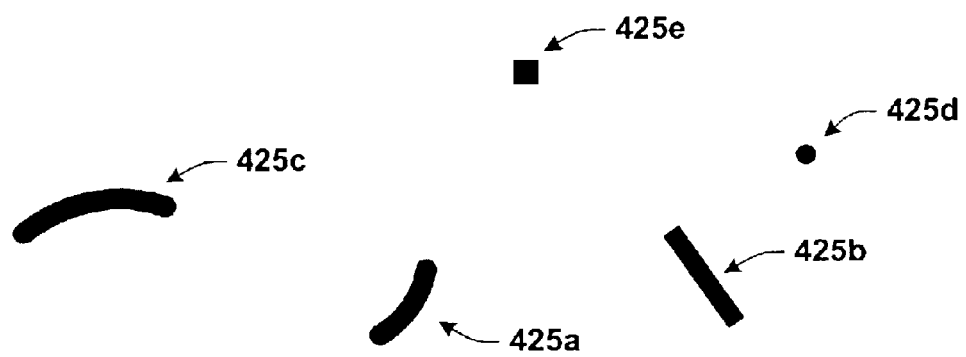
FIG. 11B is a top plan view illustrating various plugs for use in plugging one or more apertures in the plate of FIG. 11A.

Referring now to FIGS. 11A and 11B, another exemplary field adjustment disk or plate 300 is illustrated, having a variety of apertures 325 of different sizes and shapes within the scope of the invention, wherein various plugs 425 are illustrated in FIG. 11B for the apertures 325 of the plate 300. The plate 300 comprises a circular center aperture 325', as well as two sets of different sized arcuate apertures 325a and 325b, which may be selectively plugged using corresponding plugs 425a and 425c. In addition, the plate 300 comprises rectangular slot apertures 325b, pluggable using one or more corresponding rectangular plugs 425b, as well as circular and square apertures 325d and 325e, which may be plugged with corresponding plugs 425d and 425e, respectively. It will be appreciated that any size or shape apertures and/or plugs may be employed in accordance with the invention, which is not limited to the specific sizes or shapes illustrated and/or described herein.

Figure 12:
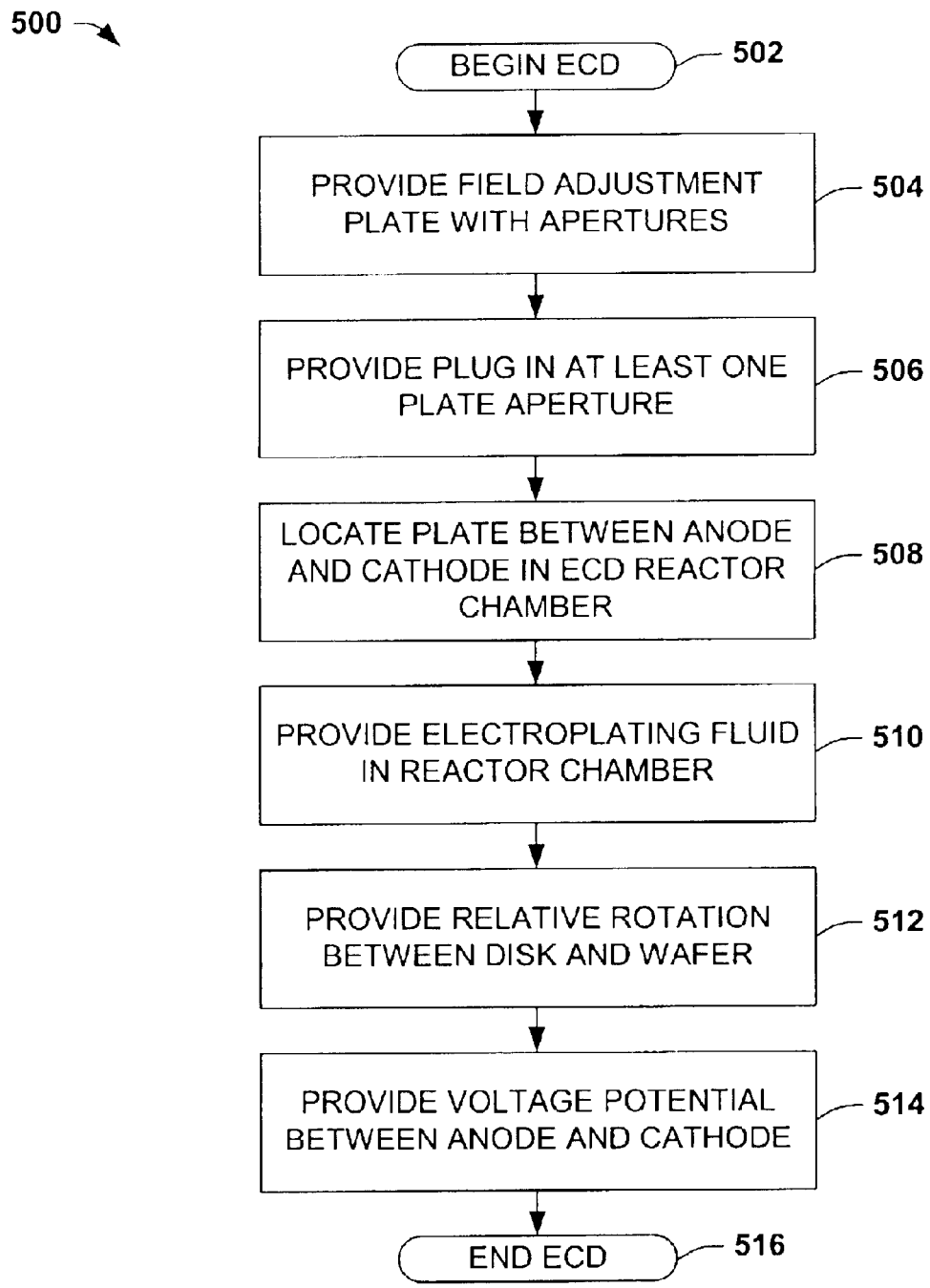
FIG. 12 is a flow diagram illustrating an exemplary method of electroplating conductive films on a semiconductor wafer in accordance with another aspect of the invention.

In accordance with still another aspect of the invention, methods are provided for electroplating conductive films on a semiconductor wafer or other workpiece, one example of which is illustrated as a method 500 in FIG. 12. Although the exemplary method 500 is illustrated and described hereinafter as a series of acts or events, it will be appreciated that the present invention is not limited by the illustrated ordering of such acts or events, as some acts may occur in different orders and/or concurrently with other acts or events apart from those illustrated and/or described herein, in accordance with the invention. In addition, not all illustrated steps may be required to implement a methodology in accordance with the present invention. Moreover, it will be appreciated that the methods according to the present invention may be implemented in association with the apparatus and systems illustrated and described herein as well as in association with other systems and structures not illustrated.

The method 500 begins at 502, where a wafer is located proximate one of a cathode and an anode in a reservoir of a reactor chamber or other electroplating system, such as in a wafer holder electrically associated with one of the anode and the cathode, whereby the wafer operates as a cathode or an anode during the plating process. A plate is provided at 504 having one or more plate apertures, and one or more plugs are used to selectively plug one or more of the apertures at 506, such as any of the exemplary field adjustment plates and plugs illustrated and described above and equivalents thereof. The field adjustment plate is located at 508 between the anode and the cathode, and an electrolytic fluid is provided in the reservoir of the reactor chamber between the cathode and the anode at 510. Relative rotation is provided between the plate and the wafer at 512, such as by rotating a cathode clamp/wafer holder to which the wafer is attached, and a voltage potential is applied between the anode and cathode at 514 so as to establishing an electric field between the wafer and the anode. The field causes plating currents at the wafer surface, resulting in deposition (e.g., plating) of conductive material, such as copper, onto the wafer surface, after which the method 500 ends at 516.

Referring now to 13A–15, other exemplary field adjustment plates and plugs are illustrated in accordance with the present invention. In FIG. 13A, another circular plate 600 is illustrated having a relatively large circular center aperture 625' and several radially spaced sets of smaller circular apertures 625a. FIGS. 13B–13D illustrate three plugs 725', 725", and 725'" of different extension lengths 726', 726", and 726'", respectively, which may be selectively employed to plug one or more of the circular apertures 625a in the disk 600.

Figure 14:
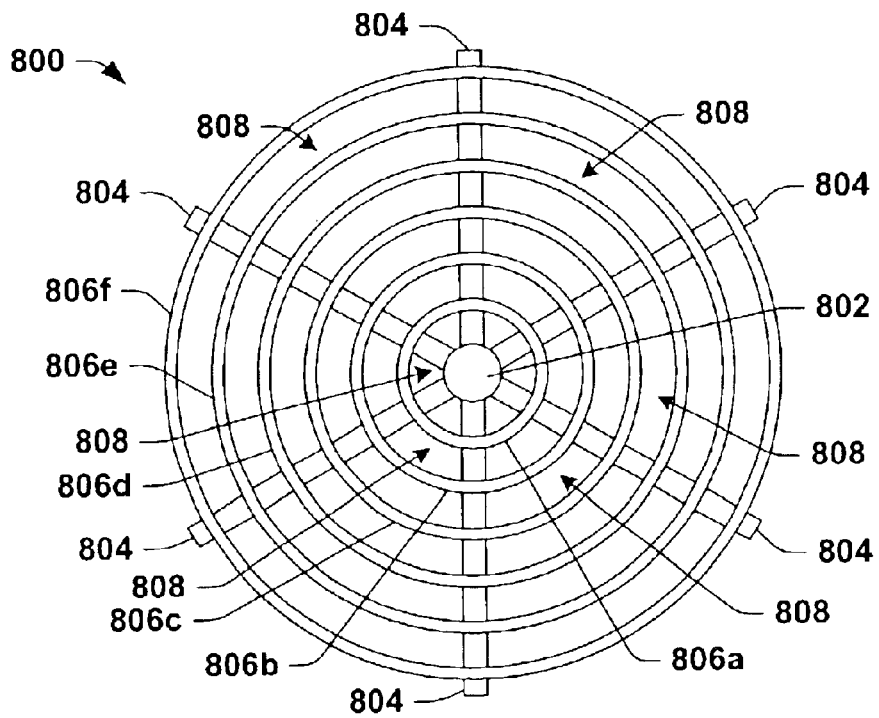
FIG. 14 is a top plan view illustrating another exemplary field adjustment plate in accordance with the invention.
Figure 15:
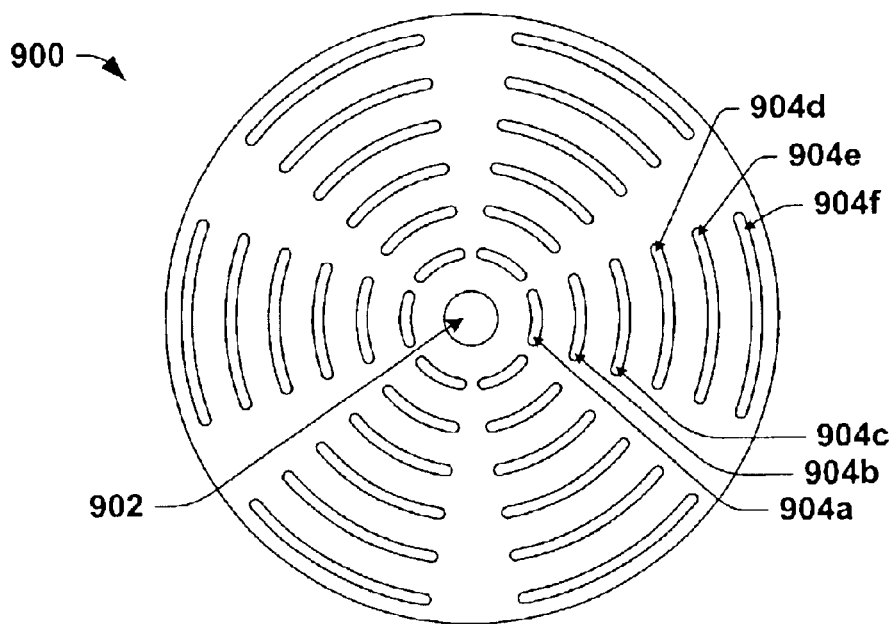
FIG. 15 is a top plan view illustrating another exemplary field adjustment plate in accordance with the invention.

FIGS. 14 and 15 illustrate two other exemplary circular field adjustment plates 800 and 900, respectively, in accordance with the invention. The plate 800 comprises a circular center member 802 with six support members 804 extending radially outwardly therefrom, and a series of six circular cross members 806a–806f, each of successively larger radiuses. The support members 804 and the cross members 806 together define radially spaced sets of angularly disposed arcuate apertures 808, through which electric field lines may pass, while selectively being blocked by the members 802, 804, and 806, and which may be wholly or partially plugged in selective fashion according to the invention.

The plate 900 of FIG. 15 comprises a plate structure similar to the plate 100 above, with a circular center aperture 902 and semicircular slot shaped plate apertures 904a–904f. As with the other plate apertures illustrated and described herein, the apertures 904 of the plate 900 may be selectively plugged to facilitate control of ECD deposition characteristics in processing semiconductor wafers or other workpieces in accordance with the invention. Other shapes and sizes of plates, apertures, and plugs are possible, apart from those illustrated and described herein. It will be appreciated by those skilled in the art that all such variants or alternates fall within the scope of the present invention and the appended claims.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A system for electroplating conductive films on a semiconductor wafer, comprising:
    a cathode and an anode disposed in a reservoir, the cathode being electrically associated with the wafer;
    an electrical power supply operatively coupled with the cathode and the anode to provide an electrical field through an electrolytic fluid between the cathode and the anode in the reservoir;
    field adjustment apparatus located in the reservoir between the cathode and the anode, the field adjustment apparatus comprising a plate comprising a first side generally facing the wafer, a second side generally facing the anode, and a plurality of plate apertures extending through the plate between the first and second sides; and
    a plug positioned in one of the plurality of plate apertures to influence the electrical field near the plug.

2. The system of claim 1, wherein the field adjustment apparatus further comprises a support located in the reservoir and operable to support the plate in the reservoir between the cathode and the anode.

3. The system of claim 1, wherein the plate is generally cylindrical, wherein the first and second sides thereof are generally circular, and wherein the plurality of plate apertures comprises:
    a first set of apertures disposed a first radial distance from a center of the plate and angularly spaced from one another, and
    a second set of apertures disposed a second radial distance from the center of the plate and angularly spaced from one another;
    wherein the second radial distance is greater than the first radial distance.

4. The system of claim 3, wherein the first set of apertures comprises a first slot angularly extending along a first semi-circle the first radial distance from the center of the plate, and wherein the second set of apertures comprises a second slot angularly extending along a second semi-circle the second radial distance from the center of the plate.

5. The system of claim 4, wherein the first set of apertures comprises a plurality of first slots individually extending angularly along first semi-circles the first radial distance from the center of the plate, and wherein the second set of apertures comprises a plurality of second slots individually extending angularly along second semi-circles the second radial distance from the center of the plate.

6. The system of claim 5, wherein the plug comprises a semicircular shape being positioned in and substantially plugging one of the first and second slots.

7. The system of claim 3, wherein the plate further comprises a circular aperture extending between the first and second sides along the center of the plate.

8. The system of claim 3, comprising first and second plugs individually positioned in one of the first and second sets of apertures.

9. The system of claim 8, wherein the first plug is positioned in one of the first set of apertures and wherein the second plug is positioned in one of the second set of apertures.

10. The system of claim 8, wherein the first and second plugs extend outward beyond the first side of the plate toward the cathode by first and second distances, respectively, and wherein the first and second distances are different.

11. The system of claim 8, wherein the first and second plugs comprise first and second extension portions having first and second extension shapes, respectively, the first and second extension portions extending outward beyond the first side of the plate toward the cathode, the first and second extension shapes being different.

12. The system of claim 3, comprising a second plug individually positioned in a different one of the plurality of plate apertures, the plug and second plug comprising first and second extension portions having first and second extension shapes, respectively, the first and second extension portions extending outward beyond the first side of the plate toward the cathode.

13. The system of claim 1, comprising a second plugs positioned in a second ones of the plurality of plate apertures to inhibit the electrical field near the second plug.

14. The system of claim 1, wherein at least first and second ones of the plurality of plate apertures are of similar sizes, and wherein the plug is selectively positionable in one of the first and second ones of the plurality of plate apertures.

15. The system of claim 14, wherein at least third and fourth ones of the plurality of plate apertures are of similar sizes with respect to one another and of different sizes with respect to the first and second ones of the plurality of plate apertures, and wherein the system comprises a second plug, the second plug being positioned in one of the third and fourth ones of the plurality of plate apertures.

16. The system of claim 15, wherein the plug and second plug extends outward beyond the first side of the plate toward the cathode by first and second distances, respectively.

17. The system of claim 15, wherein the plug and second plug comprise first and second extension portions having first and second extension shapes, respectively, the first and second extension portions extending outward beyond the first side of the plate toward the cathode.

18. The system of claim 1, comprising a second plug, the second plug being positioned in another of the plurality of plate apertures, wherein the plug and the second plug extends outward beyond the first side of the plate toward the cathode by first and second distances, respectively.

19. A system for electroplating conductive films on a semiconductor wafer, comprising:

a cathode and an anode disposed in a reservoir, the cathode being electrically associated with the wafer;

an electrical power supply operatively coupled with the cathode and the anode to provide an electrical field through an electrolytic fluid between the cathode and the anode in the reservoir;

field adjustment apparatus located in the reservoir between the cathode and the anode, the field adjustment apparatus comprising a generally circular plate comprising a generally circular first side generally facing the cathode, a generally circular second side generally facing the anode, a first set of semi-circular slots extending through the plate between the first and second sides, the first set of semi-circular slots being disposed a first radial distance from a center of the plate and angularly spaced from one another, and a second set of semi-circular slots extending through the plate between the first and second sides, the second set of semi-circular slots being disposed a second radial distance from the center of the plate and angularly spaced from one another;

wherein the second radial distance is greater than the first radial distance.

20. Apparatus for controlling electric fields during electroplating of conductive films on a semiconductor wafer, comprising:

a plate positionable between a cathode and an anode in a reservoir, the plate comprising a first side generally facing the cathode, a second side generally facing the anode, and a plurality of plate apertures extending through the plate between the first and second sides; and a plug positioned in one of the plurality of plate apertures.

21. The apparatus of claim 20, further comprising a support operable to support the plate in the reservoir between the cathode and the anode.

22. The apparatus of claim 20, wherein the plate is generally cylindrical, wherein the first and second sides thereof are generally circular, and wherein the plurality of plate apertures comprises:

a first set of apertures disposed a first radial distance from a center of the plate and angularly spaced from one another, and a second set of apertures disposed a second radial distance from the center of the plate and angularly spaced from one another, the second radial distance being greater than the first radial distance.

23. The apparatus of claim 22, wherein the first set of apertures comprises a first semi-circular slot angularly extending along a first semi-circle the first radial distance from the center of the plate, and wherein the second set of apertures comprises a second semi-circular slot angularly extending along a second semi-circle the second radial distance from the center of the plate.

24. The apparatus of claim 23, wherein the first set of apertures comprises a plurality of first semi-circular slots individually extending angularly along first semi-circles the first radial distance from the center of the plate, and wherein the second set of apertures comprises a plurality of second semi-circular slots individually extending angularly along second semi-circles the second radial distance from the center of the plate.

25. The apparatus of claim 24, wherein the plug comprises a semicircular shape being positioned in and substantially plugging one of the first and second semi-circular slots.

26. The apparatus of claim 20, comprising a second plug, the second plug being positioned in another of the plurality of plate apertures, wherein the plug second plug extends outward beyond the first side of the plate toward the cathode by first and second distances, respectively.

27. The system of claim 20, comprising a second plug individually positioned in a different ones of the plurality of plate apertures, the plug second plug comprising first and second extension portions comprising first and second extension shapes, respectively, the first and second extension portions extending outward beyond the first side of the plate toward the cathode.

28. A method of electroplating conductive films on a semiconductor wafer, comprising:

locating a wafer proximate one of a cathode and an anode in a reservoir;

providing a plate between the anode and the cathode having a plurality of plate apertures therethrough;

selectively plugging at least a portion of at least one of the plate apertures;

providing an electrolytic fluid in the reservoir between the cathode and the anode; and establishing an electric field between the cathode and the anode.

29. The method of claim 28, further comprising rotating a first one of the cathode and the anode with respect to the other of the cathode and the anode.

30. The method of claim 28, wherein providing the plate comprises providing a generally circular plate comprising a generally circular first side generally facing the cathode, a generally circular second side generally facing the anode, a first set of semi-circular slots extending through the plate between the first and second sides, the first set of semi-circular slots being disposed a first radial distance from a center of the plate and angularly spaced from one another, and a second set of semi-circular slots extending through the plate between the first and second sides, the second set of semi-circular slots being disposed a second radial distance from the center of the plate and angularly spaced from one another, wherein the second radial distance is greater than the first radial distance.

31. The method of claim 30, wherein selectively plugging at least a portion of at least one of the plate apertures comprises positioning a plug having a semi-circular shape in one of the semi-circular slots.

32. The method of claim 28, wherein selectively plugging at least a portion of at least one of the plate apertures comprises positioning first and second plugs in first and second plate apertures.

33. The method of claim 32, wherein positioning the first and second plugs comprises positioning the first and second plugs in the first and second plate apertures to extend outward beyond the first side of the plate toward the wafer by first and second distances, respectively, and wherein the first and second distances are different.

34. The method of claim 33, wherein the first and second plugs comprise first and second extension portions having different first and second extension shapes, respectively, wherein positioning the first and second plugs comprises extending the first and second extension portions outward beyond the first side of the plate toward the wafer.

35. The method of claim 32, wherein the first and second plugs comprise first and second extension portions having different first and second extension shapes, respectively, wherein positioning the first and second plugs comprises extending the first and second extension portions outward beyond the first side of the plate toward the wafer.

* * * * *